(12) United States Patent
Bhalla

(10) Patent No.: US 8,110,869 B2
(45) Date of Patent: Feb. 7, 2012

(54) PLANAR SRFET USING NO ADDITIONAL MASKS AND LAYOUT METHOD

(75) Inventor: Anup Bhalla, Santa Clara, CA (US)

(73) Assignee: Alpha & Omega Semiconductor, Ltd (BM)

( * ) Notice: Subject to any disclaimer, the term of this patent is extended or adjusted under 35 U.S.C. 154(b) by 301 days.

(21) Appl. No.: 11/906,476

(22) Filed: Oct. 1, 2007

(65) Prior Publication Data

US 2008/0029812 A1    Feb. 7, 2008

Related U.S. Application Data

(63) Continuation-in-part of application No. 11/056,346, filed on Feb. 11, 2005, now Pat. No. 7,285,822.

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .................. 257/328; 257/329; 257/330

(58) Field of Classification Search .......... 257/328–335
See application file for complete search history.

(56) References Cited

U.S. PATENT DOCUMENTS

| | | | |
|---|---|---|---|
| 6,476,442 B1 * | 11/2002 | Williams et al. | 257/328 |
| 2006/0054970 A1 * | 3/2006 | Yanagida et al. | 257/330 |
| 2007/0045727 A1 * | 3/2007 | Shiraishi et al. | 257/335 |

* cited by examiner

Primary Examiner — Thien F Tran
(74) Attorney, Agent, or Firm — Bo-In Lin

(57) ABSTRACT

A semiconductor power device supported on a semiconductor substrate of a first conductivity type with a bottom layer functioning as a bottom electrode and an epitaxial layer overlying the bottom layer with a same conductivity type as the bottom layer. The semiconductor power device includes a plurality of FET cells and each cell further includes a body region of a second conductivity type extending from a top surface into the epitaxial layer. The body region encompasses a heavy body dopant region of second conductivity type. An insulated gate is disposed on the top surface of the epitaxial layer, overlapping a first portion of the body region. A barrier control layer is disposed on the top surface of the epitaxial layer next to the body region away from the insulated gate. A conductive layer overlies the top surface of the epitaxial layer covering a second portion of the body region and the heavy body dopant region extending over the barrier control layer forming a Schottky junction diode.

2 Claims, 22 Drawing Sheets

PLANAR SRFET USING NO ADDITIONAL MASKS AND LAYOUT METHOD

This patent application is a Continuation in Part (CIP) application of a application with a Ser. No. 11/056,346 filed by a common Inventor of this application on Feb. 11, 2005 now U.S. Pat. No. 7,285,822. The Disclosures made in that application is hereby incorporated by reference.

BACKGROUND OF THE INVENTION

1. Field of the Invention

The invention relates generally to the semiconductor power devices. More particularly, this invention relates to an improved and novel manufacturing process and device configuration for integrating an MPS (Merged P-i-N/Schottky) Schottky into a planar MOSFET that does not require additional masks while improving high frequency power switching, H-bridge and synchronization rectification applications, improved body diode recovery behavior leading to lower losses and less voltage oscillations in power circuits without affecting layout of the integrated MOSFET-Schottky device.

2. Description of the Related Art

In order to reduce the power consumptions and to increase the switching speed of a power semiconductor power device, it is desirable to further reduce the on-resistance and the gate capacitance. Integration of an Schottky diode in a semiconductor power device such as a metal oxide silicon field effect transistor (MOSFET) has been implemented. In addition to device configurations and manufacturing methods to integrate the Schottky diodes into trenched MOSFET devices, there is also a need to integrate the Schottky diodes into the planar MOSFET devices. The integration of the Schottky diodes into the planar MOSFET device improves the body diode recovery behavior that leads to lower losses and less voltage oscillations in power circuits. However, conventional ways of manufacturing the planar MOSFET devices with integrated Schottky diodes often require additional masks for the formation of the Schottky diodes in an Schottky regions between the MOSFET cells. Therefore, higher manufacturing costs and more complicate processes are necessary for implementing the planar MOSFET device with the Schottky diodes. For this reason, there is still a need to improve the processes for manufacturing the MOSFET devices to integrate with Schottky diodes with new and improved device configurations to achieve simplified manufacturing processes.

FIGS. 1A and 1B show the standard MOSFET devices that integrate the Schottky diodes to bypass the body diode thus improving the behavior of a MOSFET device. Improvements in the MOSFET device performances enhance the H-bridge and synchronization rectification applications. Specifically, FIG. 1A shows a MOSFET with an integrated Junction Barrier controlled Schottky ABS) area. The integrated JBS may be an Schottky diode array with a P-N junction grid interspersed between the Schottky contacts. The P-N junction will pinch-off the channel regions under the Schottky contacts to inhibit the formation of large reverse leakage current once a threshold reverse-biased voltage is applied. The shielding effect caused by the depletion layer also improves the breakdown voltage. However, there is a tradeoff that due to an increase of the series resistance. Also, since the presence of P-N junction in the integrated JBS regions takes up a large portion of surface area, for practical considerations, it may be required to reduce the overall Schottky contact areas dedicated to the forward conduction. Under that circumstance, there is an increase of the on-state forward voltage drop cause by this reduction of the overall Schottky contact area. In FIG. 1B, the integrated trench MOS barrier Schottky (TMBS) is implemented. The integrated TMBS includes Schottky diode array interspersed with MOS trench. The charge coupling between the majority charge carrier in the mesa-shaped portion of the epitaxial/drift region and the metal on the insulated sidewalls of the trenches causes a redistribution of the electric filed profile under the Schottky contact which improves the breakdown and reduces reverse leakage current.

U.S. Pat. No. 4,675,713 discloses a method of using the source Schottky junction as the body contact for a semiconductor power device. U.S. Pat. No. 4,983,535 discloses a fabrication method to manufacture a DMOS device with a source implemented with a refractory metal Schottky barrier located on top of the body region. However, these devices still have the limitations of using metals of relatively high barrier height. The device performance cannot satisfy the modern applications that require further reduction on resistance and higher drive currents.

FIG. 2 shows an improved DMOS submitted as a co-pending Application by co-inventors of this Patent Application. The DMOS has an improved configuration. Specifically, in proximity of the gate trench and adjacent to the source, there is a source-body contact trench with an anti-punch through implant disposed along the trench wall. An integrated Schottky diode is formed by depositing a high barrier height metal at the bottom of the source-body contact trench to function as the integrated Schottky contacts. A low barrier height metal is further deposited overlaying the high barrier height metal to provide ohmic contact for source and body. The DMOS device as shown in FIG. 2 provides the advantage of integrating a Schottky in every cell with no loss of die active area to form such a Schottky as in older approach. However, the high barrier height metal as required to achieve acceptable low leakage current in the off state presents a disadvantage due to the higher costs of depositing both the high barrier height metal and the low barrier height metal to meet the requirements of Schottky and source-body ohmic contact.

Additionally, the above device configurations as shown in FIGS. 1A, 1B and 2 are still limited by a breakdown vulnerability at bottom corners of the P+ pocket regions as that shown in FIGS. 1C and 1D. The breakdown vulnerability at the bottom corners at the body type dopant (P+ pocket) regions is due to a small radius of a curvature at the junction near the bottom corners of the P+ pocket regions. Furthermore, there is an abrupt dopant distribution reversal profile as that shown in FIG. 1D. FIG. 1D compares the variation of the doping profile in the JBS P+ pocket region to the doping profile in the MOSFET P body regions along two vertical lines A-A' and B-B' shown on FIG. 1C.

Therefore, a need still exists in the art of power semiconductor device design and manufacture to provide new manufacturing method and device configuration in forming the semiconductor power devices. such that the above discussed problems and limitations can be resolved.

SUMMARY OF THE PRESENT INVENTION

It is therefore an aspect of the present invention to provide a new and improved manufacturing processes and device configuration for the planar MOSFET integrated with Schottky diodes. The new configuration and manufacturing processes are implemented without requiring additional mask such that semiconductor power devices with improved body diode recovery behavior and lower losses and less voltage oscillations in the power circuits are achievable with a reduced production costs.

Another aspect of this invention is to provide new layout configurations of the MOSFET device integrated with Schottky diodes with the FET and Schottky regions arranged in optimized layout configurations such that higher cell density and improved device performances are achieved.

Another aspect of this invention is to provide semiconductor power device integrated with Schottky diode to increase the breakdown voltage of the device. Specifically, an aspect of this invention is to resolve the breakdown vulnerability at the bottom corners of the P+ pocket regions without changing the layout of the MOSFET devices that integrated with the Schottky diode for performance improvements.

Another aspect of this invention is to form the Junction Barrier controlled Schottky (JBS) rectifiers in the Schottky area with improved doping profile to increase the breakdown voltage without affecting the MOSFET cell performance. Furthermore, the JBS rectifiers are implemented with stripe, square closed cells, circular closed cells and hexagonal closed cells configurations.

Another aspect of this invention is to form the JBS rectifiers in the Schottky area with maximized Schottky area by forming the gate fingers as a comb shape with a bottom peripheral gate runner and not running the peripheral gate bus all the way around the die.

Briefly in a preferred embodiment this invention discloses a semiconductor power device supported on a semiconductor substrate of a first conductivity type having a bottom layer functioning as a bottom electrode and an epitaxial layer overlying the bottom layer having a same conductivity type as the bottom layer. The semiconductor power device further includes a plurality of FET power cells. Each of these cells includes a FET body regions of a second conductivity type surrounding a gate. Each of the FET body regions encompassing a source region therein doped with ions of first conductivity type. Each of the FET body regions further includes a body contact region next to the source region doped with ions of the second conductivity with higher dopant concentration than the FET body regions. A plurality of Schottky diodes are disposed between the FET body regions constituting doped JBS regions near a top surface of the semiconductor substrate constituting a junction barrier Schottky (JBS) with the epitaxial layer disposed between FET body regions. A Schottky contact metal layer is disposed on a top surface constituting an ohmic contact to the source and body contact regions and covering the epitaxial layer between the FET body regions constituting a Schottky junction. The epitaxial layer between the FET body regions further has a shallow layer of doped region for enhancing a performance of the Schottky diodes.

Furthermore, this invention discloses a method to form a semiconductor power device with an active cell area that includes a plurality of power transistor cells and a Junction Barrier controlled Schottky (JBS) area that includes a plurality of Schottky diodes. The method further includes a method of implanting body type dopant ions through metal contact opening into an epitaxial layer to form a counter-dopant region surrounding the JBS P+ pockets to reduce a sudden reversal dopant profile near the PN junction to prevent an early breakdown in the Schottky area.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 3A:
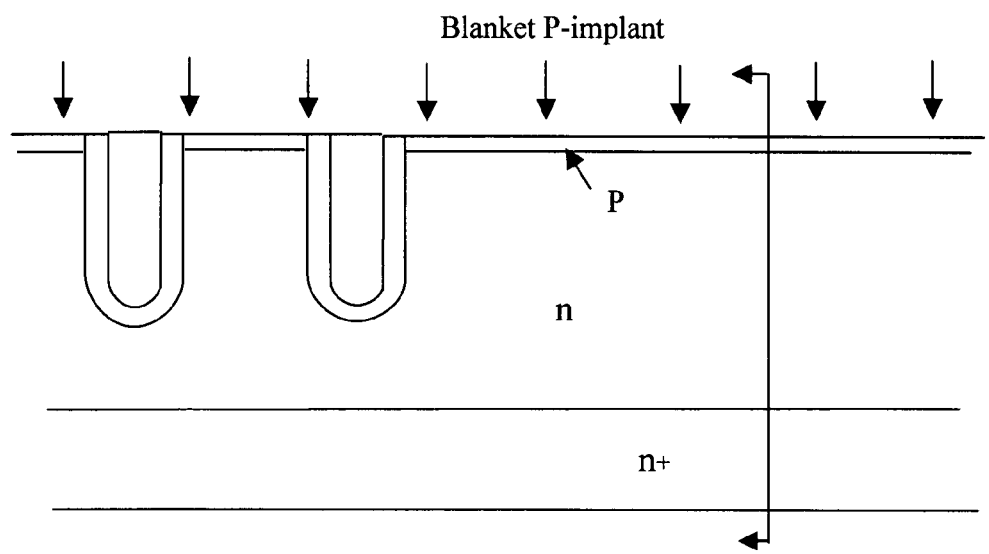
FIGS. 3A and 3B are side cross sectional views before and after the diffusion operation of a MOSFET device of this invention.
Figure 3B:
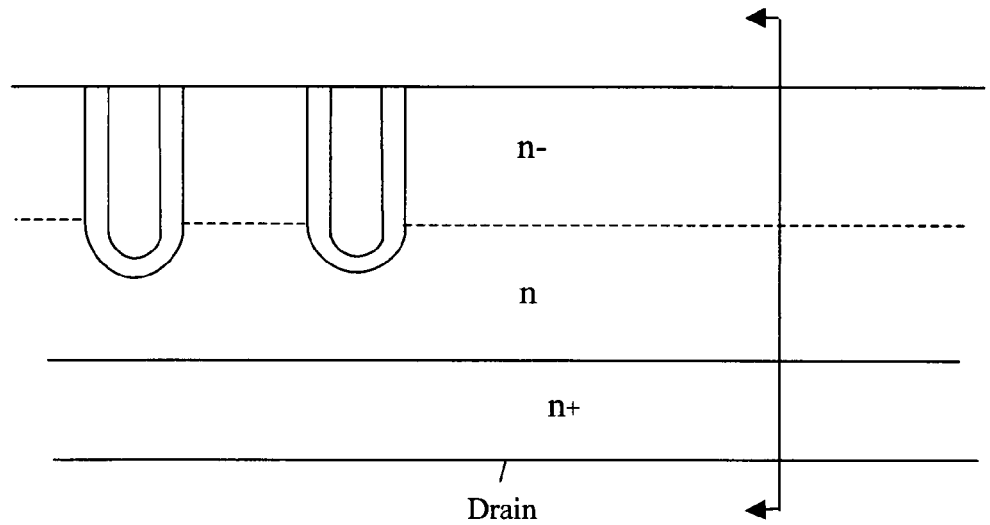
Figure 3C:
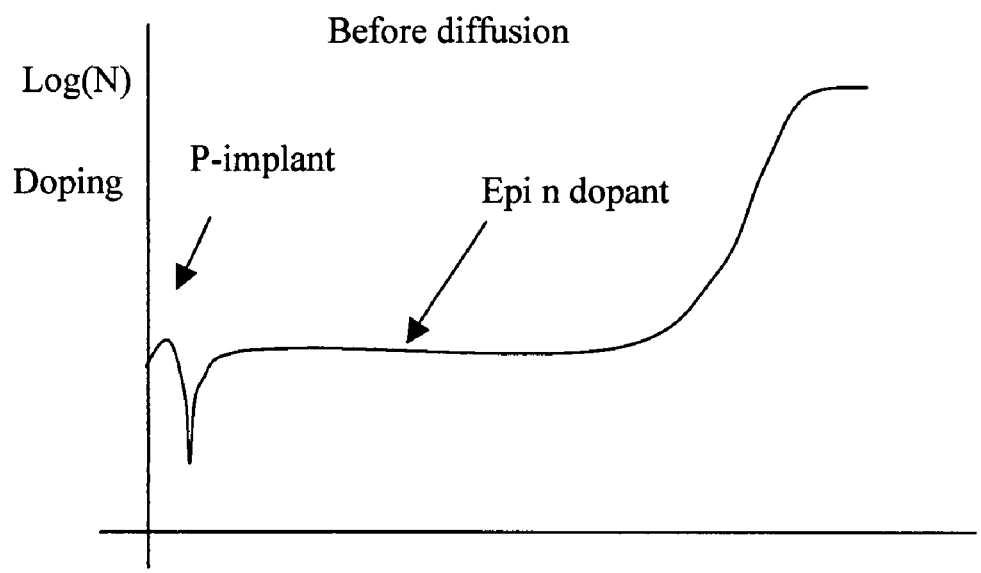
FIGS. 3C and 3D are dopant profile diagrams before and after a light body-type dopant diffusion process of a MOSFET device of this invention.
Figure 3D:
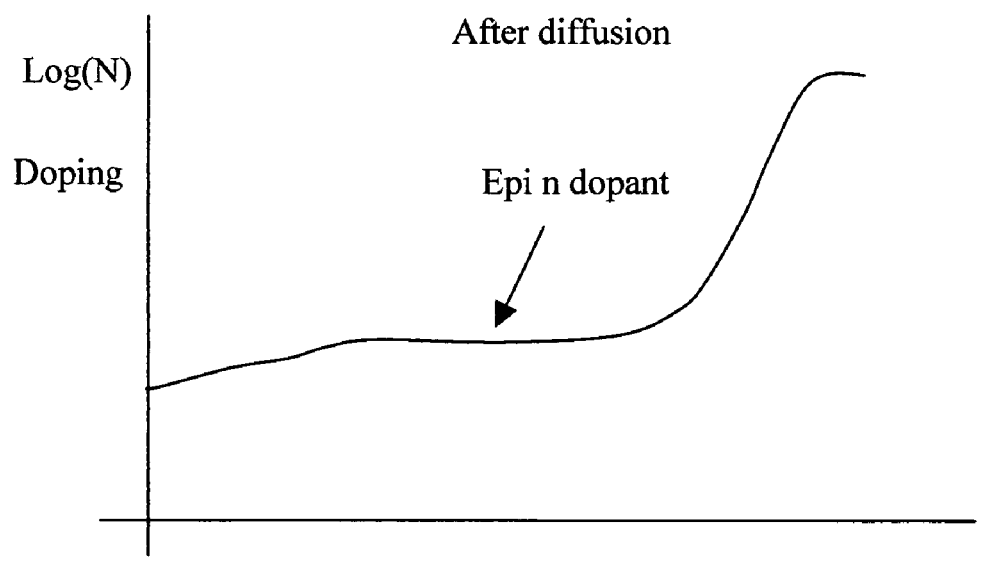
Figure 3E:
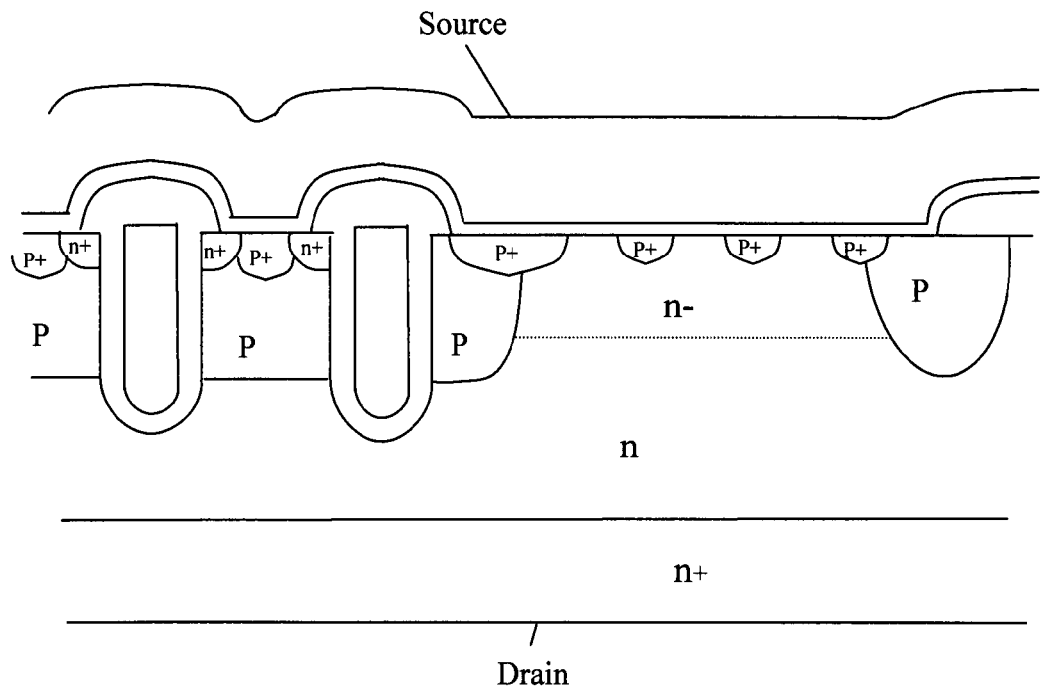
FIG. 3E is a side cross sectional view of the MOSFET device of this invention with improved breakdown voltage in the Schottky regions with the MOS mesa area unaffected.

Referring to FIGS. 3A and 3B for the side cross sectional views of the JBS area to provide the rectification function for a MOSFET device. FIG. 3A shows a blank implant of a low dose of body type dopant ions. For N channel MOSFET device, Boron ions with dosage $5\times10^{11}$ to $5\times10^{12}/cm^2$ may be implanted into the epitaxial layer with energy from 40-500 Kev, preferably with 80-300 Kev. The blank implant of the body type dopant ions is to compensate and lower the doping concentration of a portion of the epitaxial layer to increase epitaxial layer breakdown voltage. In FIG. 3B, the body dopant is then diffused by applying an elevated diffusion temperature ranging from 1000 to 1150 degrees for 1 to 3 hours to diffusion the body type dopant into a depth shallower than the depth of MOSFET body region form in a later step. The implanting body type dopant ions compensate a portion of epi dopant and generate an N− region in the epitaxial layer. This would not significantly affect the MOSFET breakdown or other performance parameter because the P− implant does not exceed the dopant concentration and boundary of MOSFET P body region, which has a higher body type ion concentration. The body type dopant implant can also be carried out after clearing the Schottky area, namely after the oxide etch for Schottky formation. In that case, it is preferred to do multiple energies to create a wider flat counter-doped n− region at the surface as there is less thermal steps in this late device manufacture stage to further spread out the P− doping region. FIG. 3C shows the dopant profile along a vertical line C-C' before the diffusion and FIG. 3D shows the dopant profile after the body type dopant diffusion process. After the diffusion, the N− region has a lower and smooth variation of dopant along the vertical direction in regions for forming Schottky junction barrier. The lower epi dopant concentration in N− region improves breakdown voltage in N− region. FIG. 3E is a cross sectional view of a MOSFET with the Schottky junction areas formed follow the processes shown in FIGS. 3A and 3B. The Schottky junction barriers are surrounded with a lightly doped N− dopant region and the upper portion of the epitaxial layer is now formed with an N− region. The breakdown in this region is increased due to lower carrier concentration. Furthermore the lower concentration in N− region helps to reduce the electrical field across the P+/N− junction although the dopant profile across the P+ Schottky pocket region may be still abrupt. The overall breakdown in Schottky area is thus increased. The light dose body type dopant implant would not affect the MOSFET active cell area because the dopant profiles in the mesa areas are not affected. The counter dopant region disposed in the JBS area having an epitaxial dopant concentration reduction ranging from 20 to 80 percent whereby performance parameters of the power transistor cell in the active cell area are not affected.

Figure 4A:
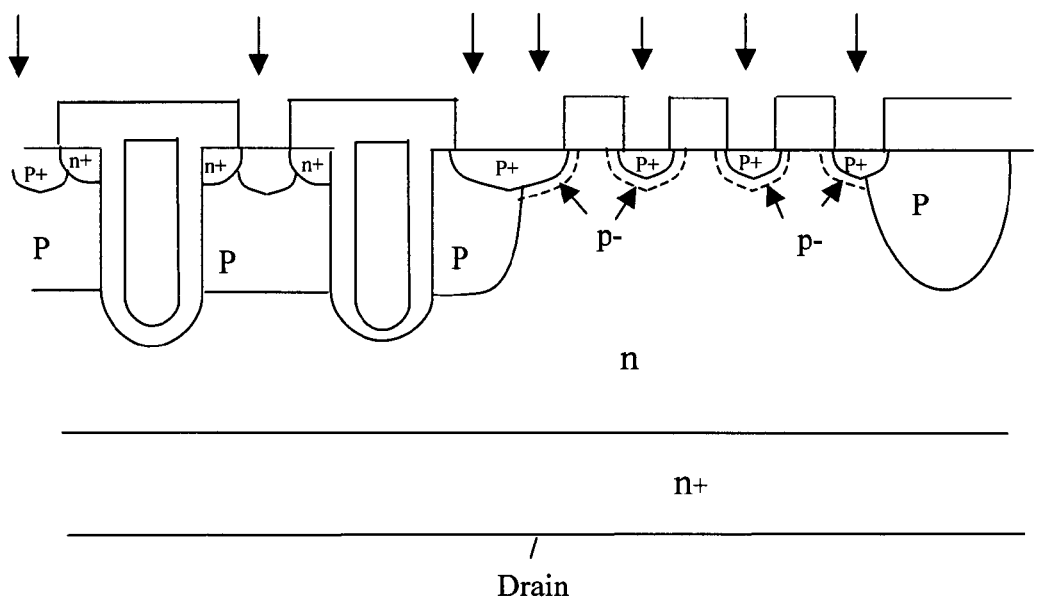
FIG. 4A is a cross sectional view of an alternate MOSFET of this invention with improved breakdown voltage and FIG. 4B is a dopant profile diagram of FIG. 4A.
Figure 4B:
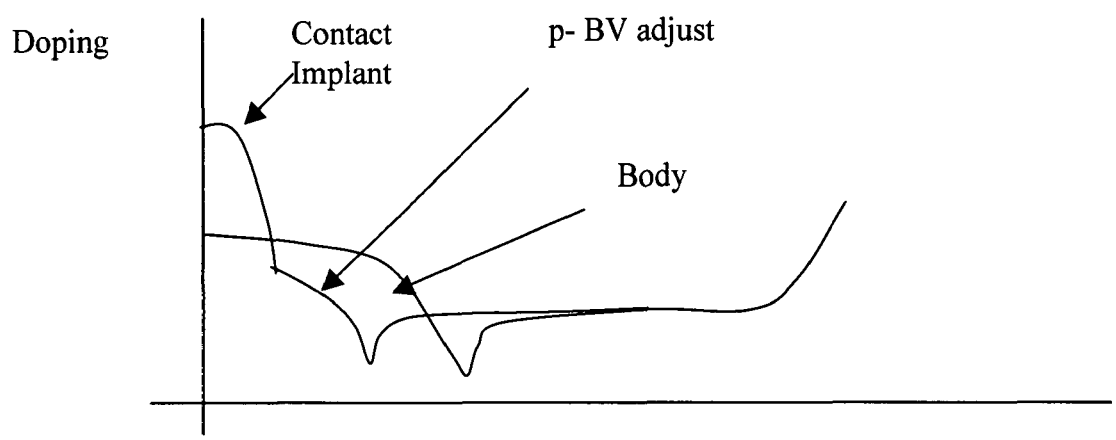

FIG. 4A is a cross sectional view of another preferred embodiment of this invention. An implantation of low dose high-energy P-type dopant ions at an energy level of about 240 to 360 kev is carried out at the time when a contact implant is carried out through the contact openings. The dose is light enough, e.g., 0.1 to $2\times10^{12}/cm^2$ of boron ions, to overcome the epitaxial doping and to create a P−/N− junction as shown in FIG. 4A. These P− regions surrounding the P+ Schottky pocket regions near the top surface of the epitaxial layer is sufficient to elevate the breakdown voltage in the JBS regions. In the meantime, the dose of the high-energy body dopant implant is sufficiently light, i.e., about one-tenth of a typical body implant dosage, so that the performance of the MOSFET device, other than the Schottky BV, such as the threshold voltage, is maintained the same without being affected. FIG. 4B is a doping profile of the MOSFET device along a vertical direction in the body type dopant region after the BV voltage adjustment implant compare to the MOSFET body region doping profile. As shown in FIG. 4B, the slope of P dopant concentration in Schottky P+ pocket region has been greatly changed from abrupt reversal to a gradual variation. This greatly reduces the electric field across the P-N junction in the Schottky pocket region. Furthermore, it greatly reduces the fringing electric field. As a result the premature breakdown due to abrupt dopant distribution and sharp corner are eliminated.

Figure 5A:
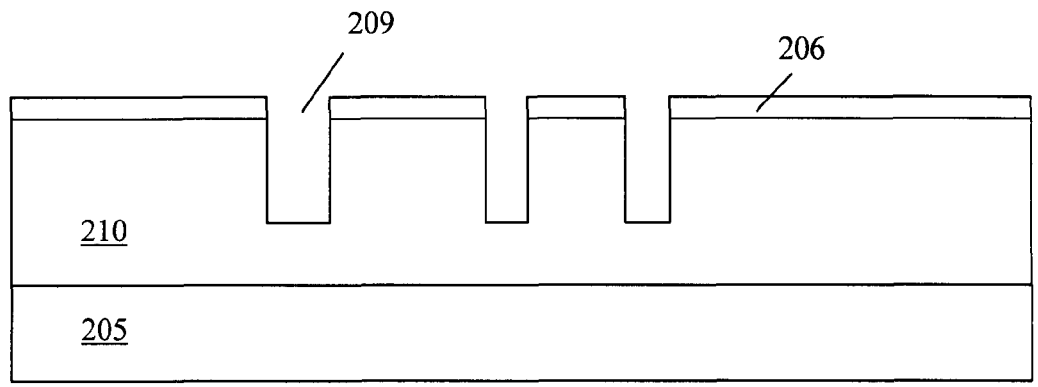
FIGS. 5A to 5K are a serial cross sectional views for describing the manufacturing processes to provide a trenched MOSFET device as shown in FIG. 4A.
Figure 5B:
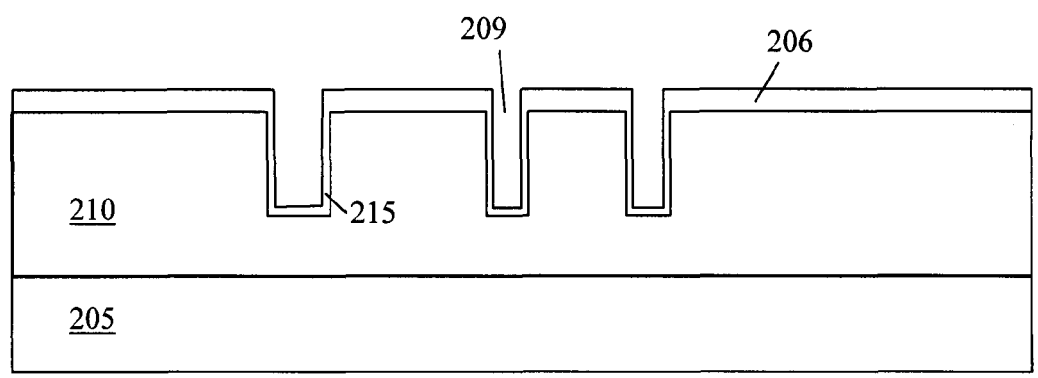
Figure 5C:
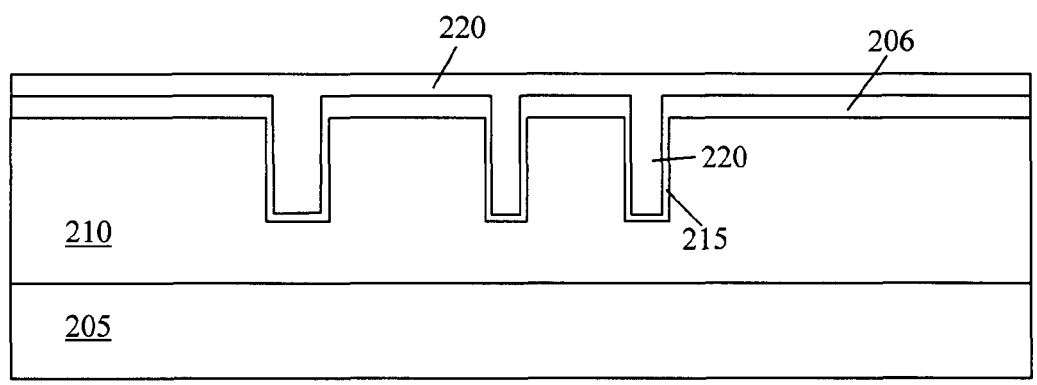

Referring to FIGS. 5A to 5K for a series of cross sectional views to illustrate the processing steps for manufacturing a MOSFET device as shown in FIG. 4A. In FIG. 5A, a trench mask (not shown) is applied as first mask to create an oxide hard mask 206 and then removed. Referring to FIG. 5B, a trench etch process is carried out to open a plurality of trenches 209 in an epitaxial layer 210 supported on a substrate 205. In FIG. 5C, a sacrificial oxidation is performed followed by an oxide etch to remove the damaged surface on the trench wall to smooth the sidewalls. Then a gate oxidation is performed to grow a gate oxide layer 215. An oxide layer 215 is grown followed by depositing a polysilicon layer 220 into the trenches.

Figure 5D:
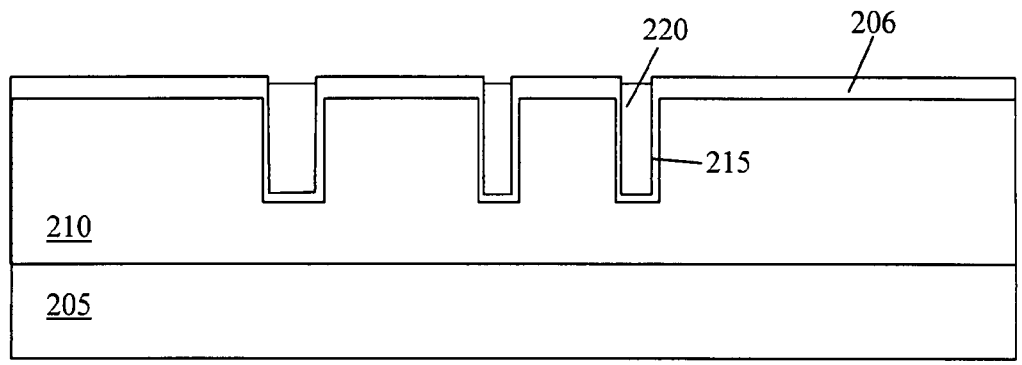
Figure 5E:
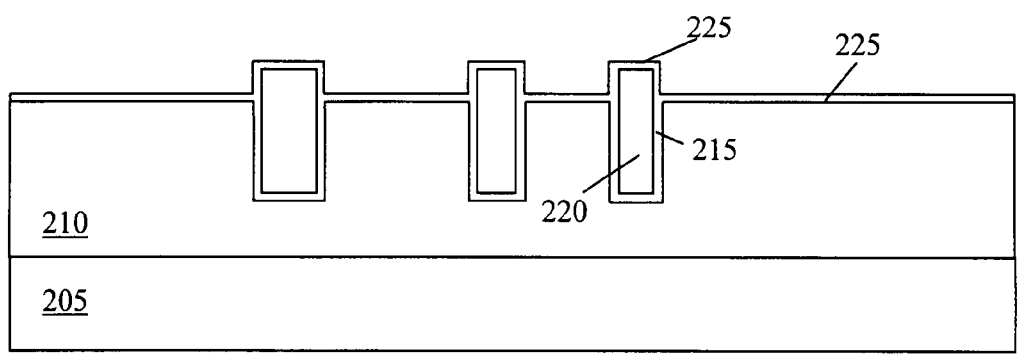
Figure 5F:
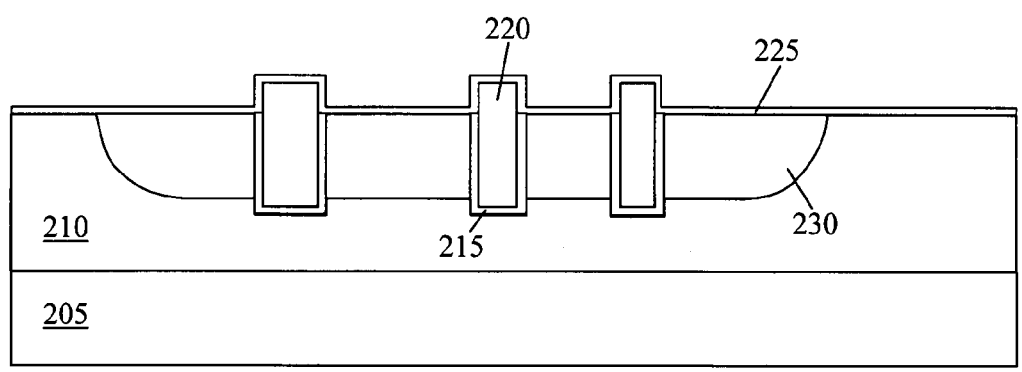
Figure 5G:
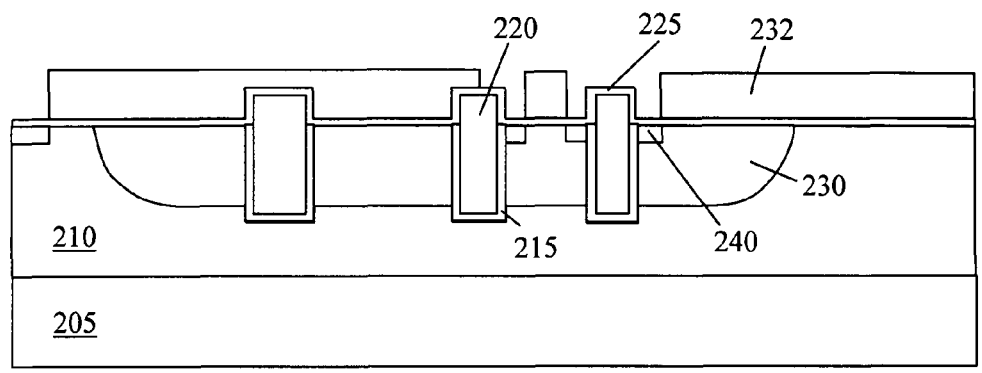
Figure 5H:
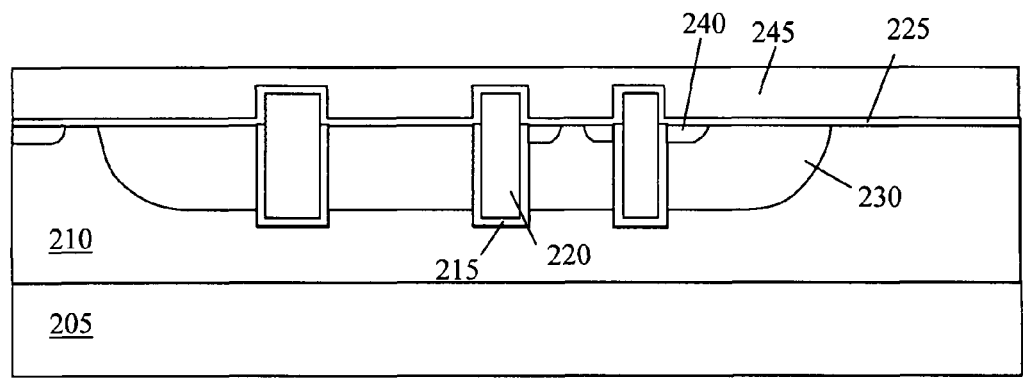
Figure 5I:
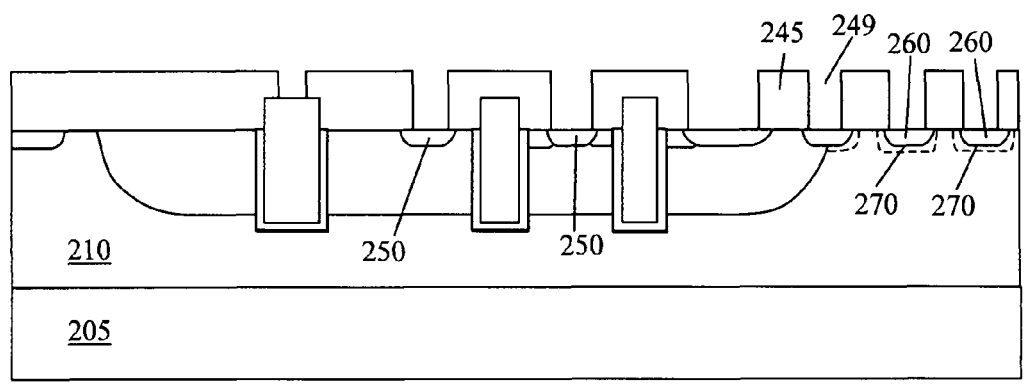

In FIG. 5D, a blanket polysilicon etch back is performed to etch back the polysilicon layer 220. The polysilicon layer 220 is etched back without a mask until it is just below the top surface of the oxide hard-mask 206. In FIG. 5E, the hard-mask 206 is etched off followed an oxide re-growth to form an oxide layer 225 on the top surface. In FIG. 5F, a body mask (not shown) is applied to implant the body dopant into the body regions followed by a diffusion process to diffuse the body regions 230 into the epitaxial layer 210. In FIG. 5G, a source mask 232 is applied for source dopant implant to form the source regions 240. In FIG. 5H, the source mask 232 is removed followed by a source drive to diffuse the source regions 240 encompassed in the body regions 230 into the epitaxial layer 210. Then an LTO/BPSG insulation layer 245 is formed on top of the MOSFET device. In FIG. 5I a contact mask (not shown) is applied to open a plurality of contact openings 249. Then a heavy body type dopant implant with does about $1\text{-}3\times10^{13}/cm^2$ is carried out to form the contact-enhanced body dopant regions 250 and a plurality of junction barrier Schottky P+ pocket regions 260 in the Schottky areas. Then an implantation of low dose high-energy P-type dopant ions at an energy level of about 240 to 360 kev is carried out through the contact openings 249 to form a light body doped regions 270 surrounding the P+ pocket regions 260 as that shown in FIG. 4A. The dose is light enough, e.g., 0.1 to $2\times10^{12}/cm^2$ of boron ions, to overcome the epitaxial doping to create a P−/N− junction.

Figure 5J:
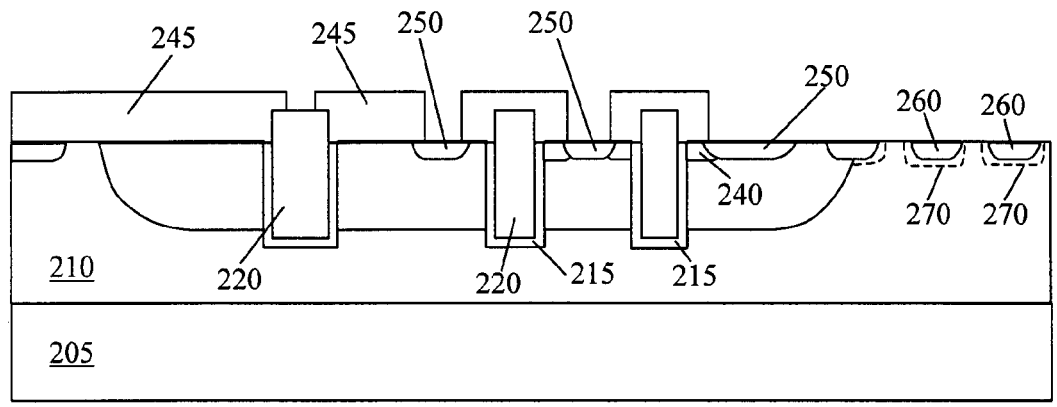
Figure 5K:
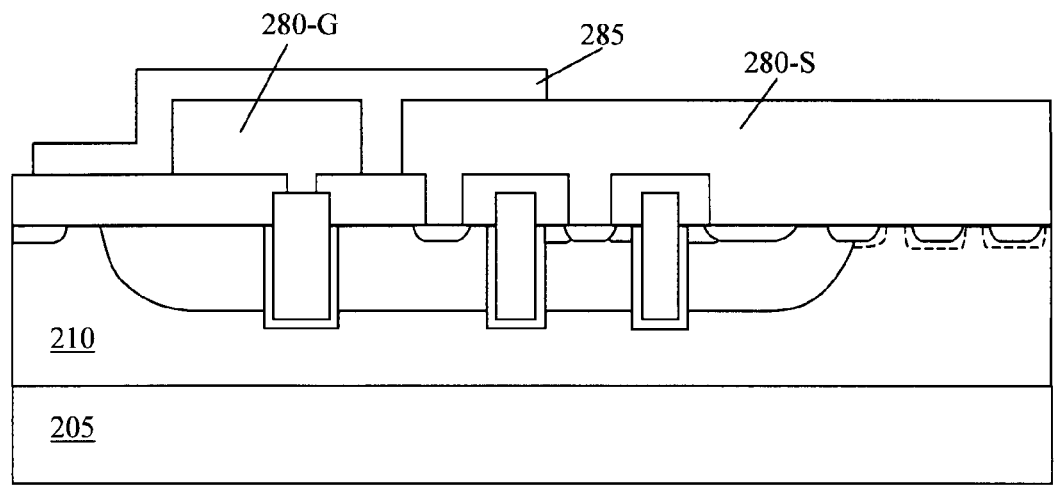

In FIG. 5J, an Schottky activation mask is applied to remove part of the insulation layer 245 from the Schottky areas. In FIG. 5K, a metal layer 280 is formed on the top surface and a metal mask (not shown) is applied to pattern the metal layer into a source metal 280-S and a gate metal 280-G followed by forming and patterning a passivation layer 285 to complete the manufacturing processes of the MOSFET device.

Figure 6A:
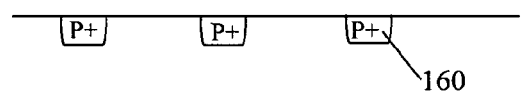
FIG. 6A is a side cross sectional view of junction barrier Schottky (BS) rectifier and FIGS. 6B to 6E are top views showing the JBS rectifiers are implemented with stripe, square closed cells, circular closed cells and hexagonal closed cells configurations.
Figure 6B:
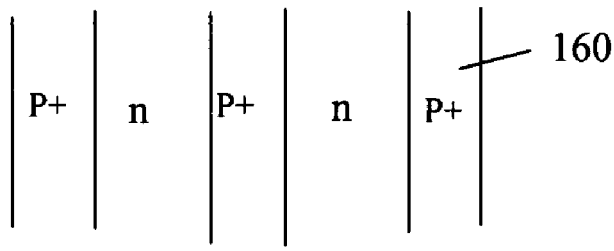
Figure 6C:
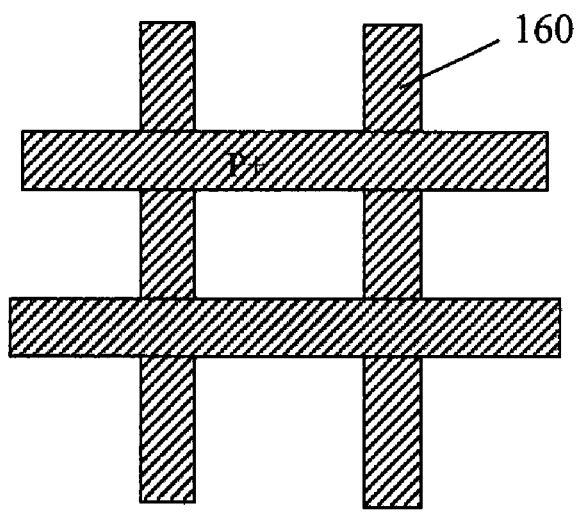
Figure 6D:
Figure 6E:
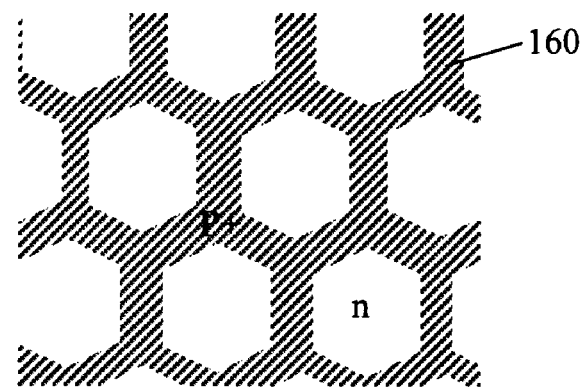

The JBS may be formed in one area or in a plurality of areas on the MOSFET die. It could also be formed in a macro cell structure where each macro cell comprises a plurality of MOSFET cells and a JBS area as in FIG. 8. Each JBS area may further form a plurality of JBS diodes in different layout. FIG. 6A is a side cross sectional view and FIGS. 6B to 6E are top views of the layout of the JBS P+ pocket regions 160 for this invention. The Schottky barrier junction regions interspersed by P+ pocket regions are implemented with different shapes in the MOSFET device. FIGS. 6B to 6E show that the Schottky junction barrier regions are formed with stripe, square closed cells, circular closed cells and hexagonal closed cells configurations respectfully.

Figure 7:
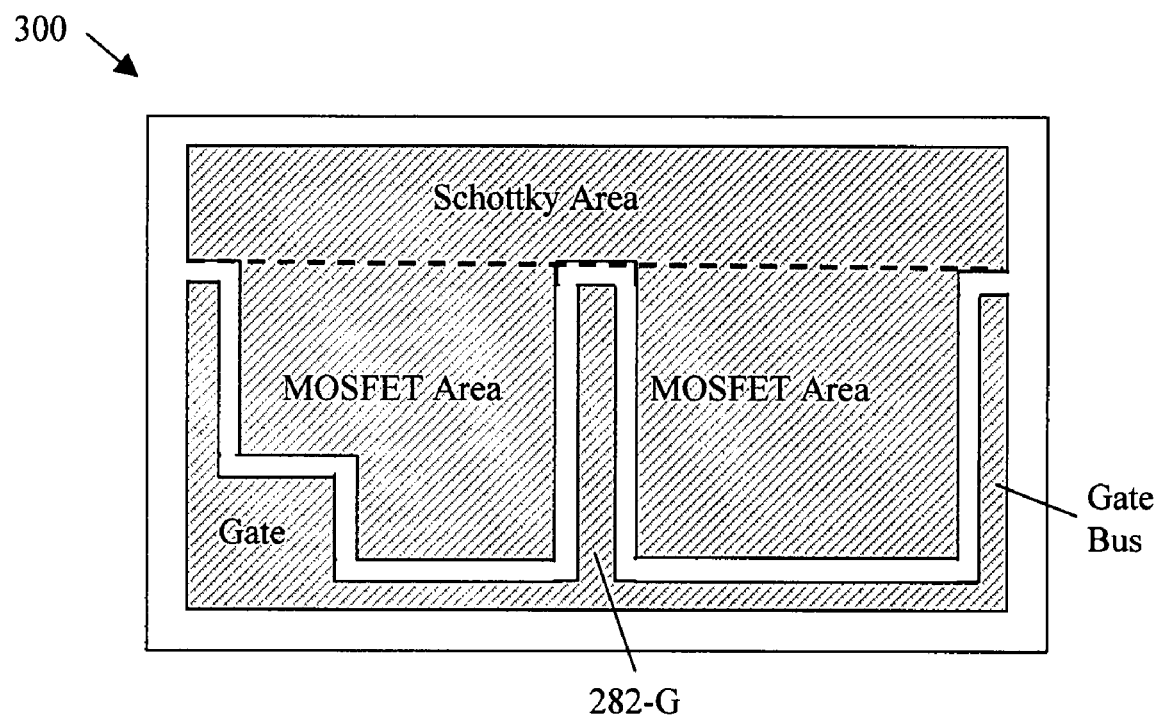
FIG. 7 is a top view of a MOSFET device where the Schottky area is maximized by not running the peripheral gate bus all the way around the die with the gage fingers formed as a comb shape with a bottom peripheral gate runner.
Figure 8:
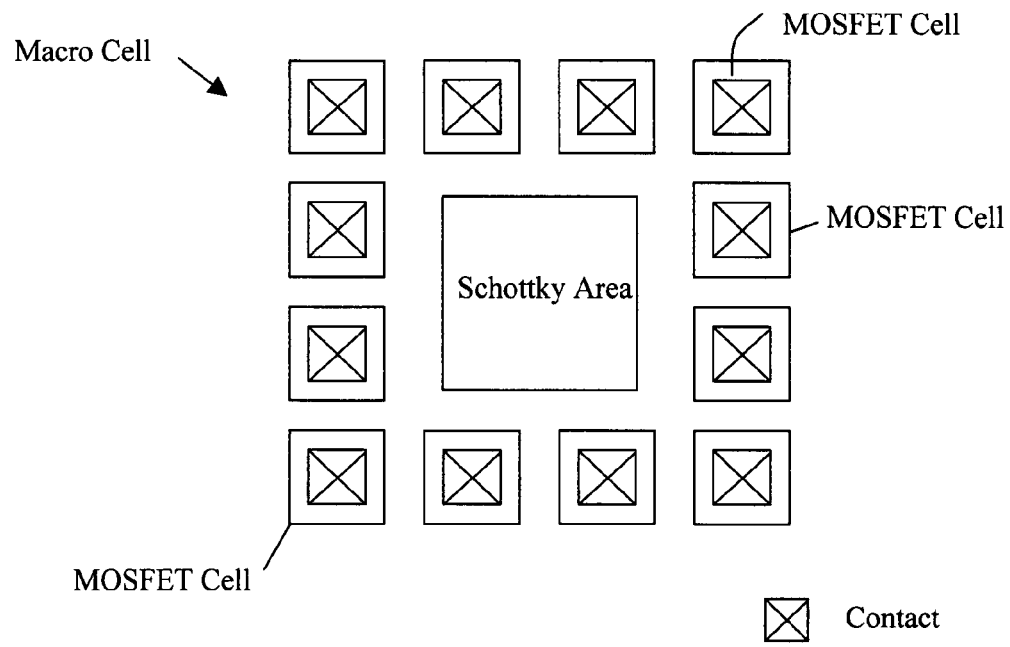
FIG. 8 is a top view of a MOSFET device where the Schottky area is formed within a macro cell structure.

FIG. 7 is a top view of a MOSFET device 300 where the Schottky area is maximized by not running the peripheral gate bus all the way around the die with the gate fingers 282-G formed as a comb shape with a bottom peripheral gate runner. Referring to FIG. 8 for a top view of a MOSFET device where the Schottky area is formed within a macro cell structure.

Figure 1A:
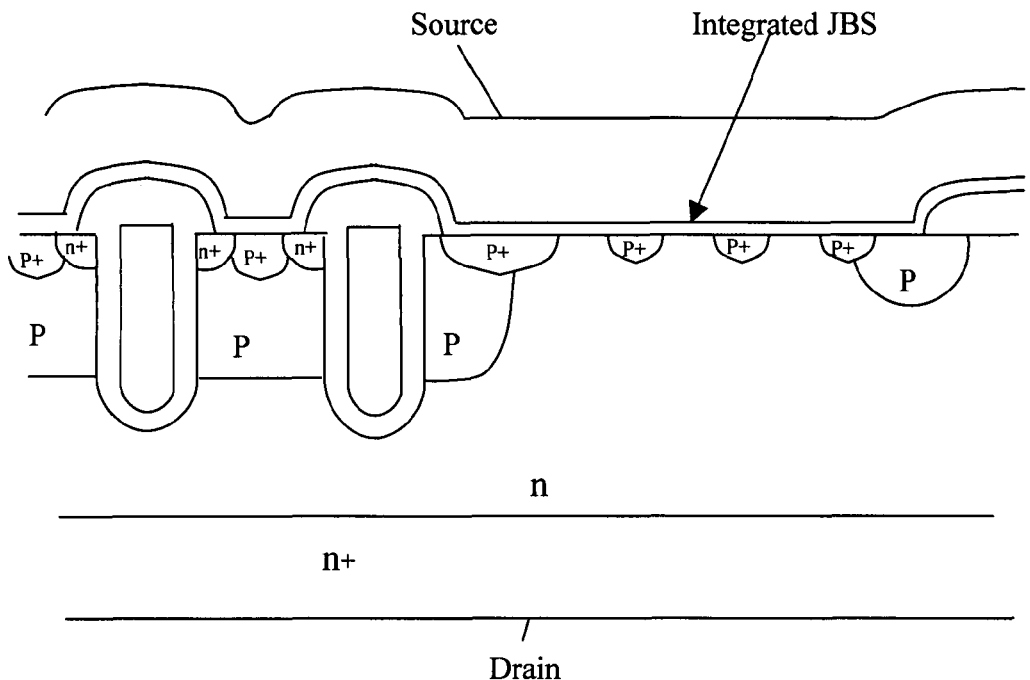
FIG. 1A is a cross sectional view of a conventional trenched MOSFET power device with an integrated Junction Barrier controlled Schottky area.
Figure 1B:
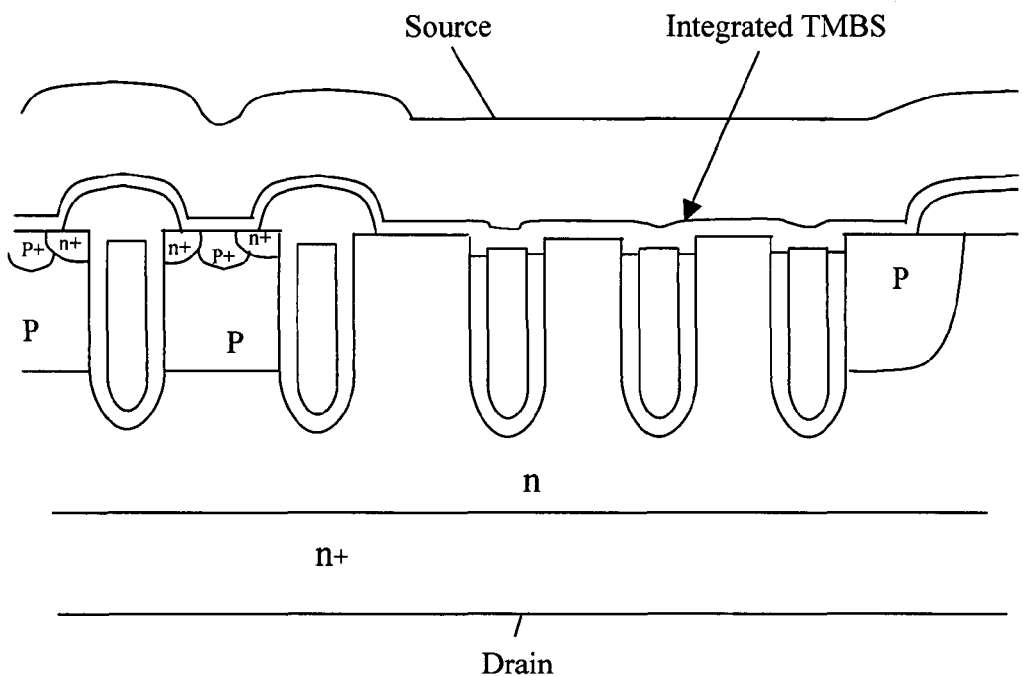
FIG. 1B is a cross sectional view of another conventional trenched MOSFET power device with the integrated Trench MOS Barrier controlled Schottky (TMBS).
Figure 1C:
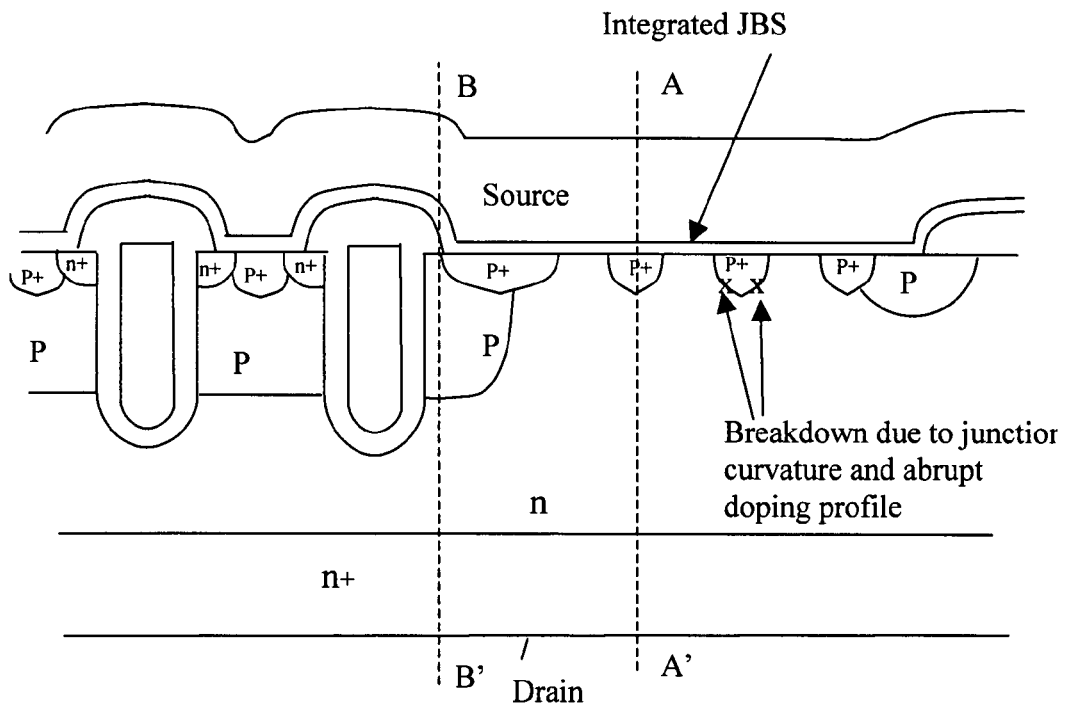
FIG. 1C is a cross sectional view of a conventional trenched MOSFET power device with an integrated JBS area with the breakdown vulnerable points at the bottom corners of the body-type dopant (P+ pocket) regions.
Figure 1D:
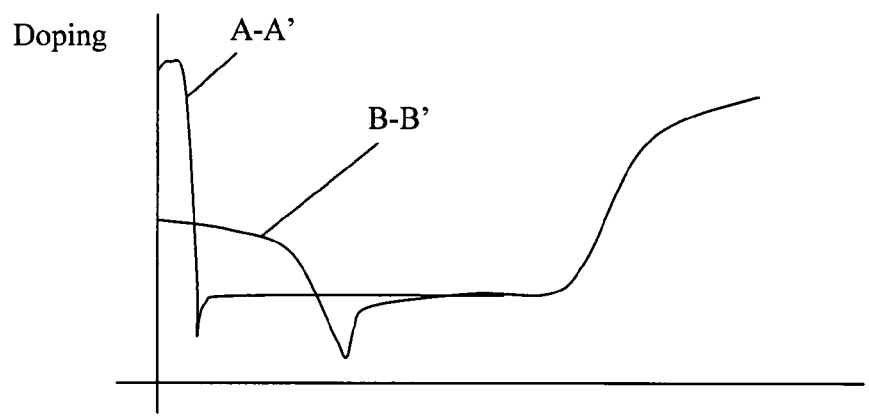
FIG. 1D is a dopant concentration diagram along a vertical direction in the P+ pocket region and the MOSFET body regions of FIGS. 1A and 1B for illustrating the reasons of breakdown vulnerability.
Figure 2:
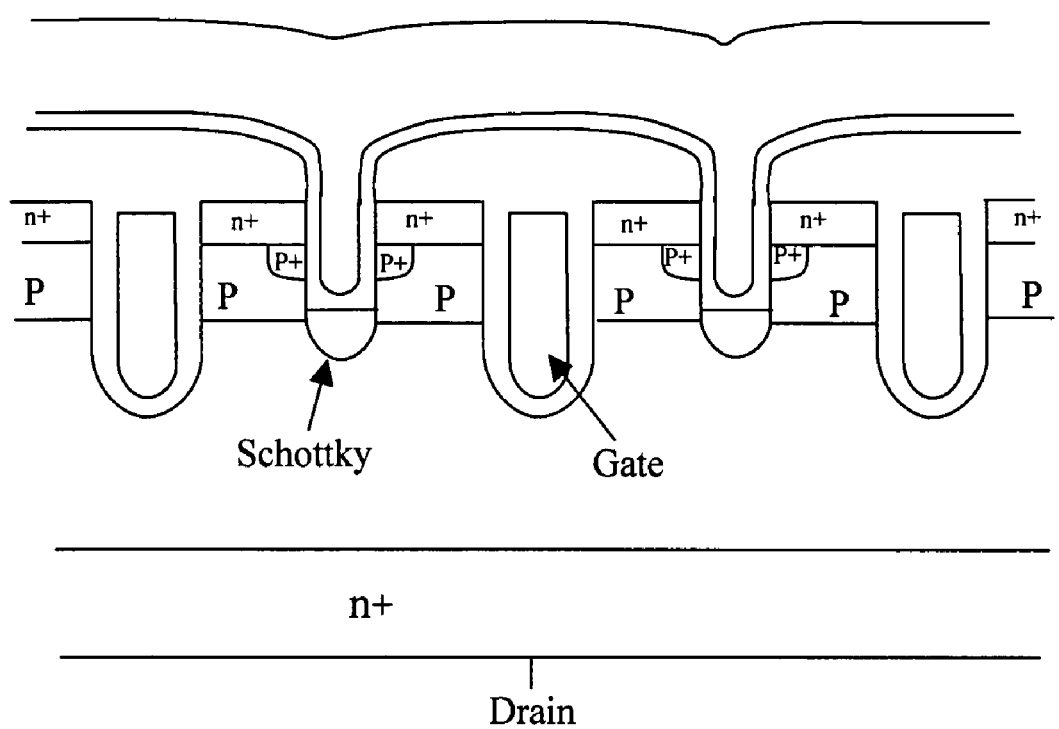
FIG. 2 shows is a cross sectional view of an improved DMOS of a co-pending Application by co-inventors of this Patent Application.
Figure 9A:
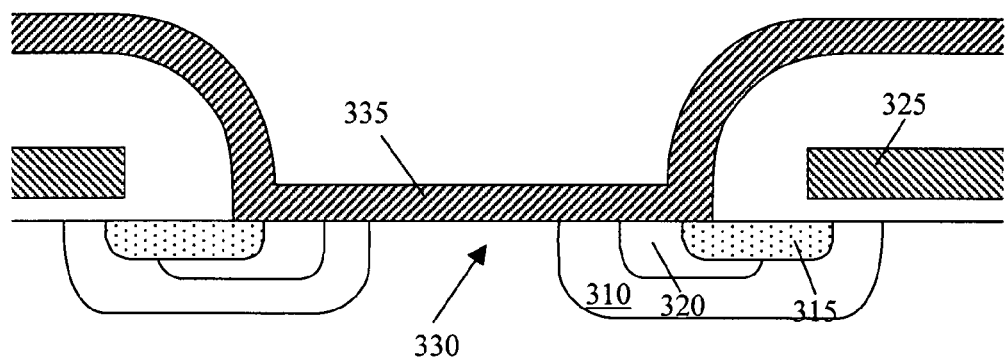
FIGS. 9A to 9C are cross sectional views of three alternate embodiments of the Schottky devices this invention.
Figure 9B:
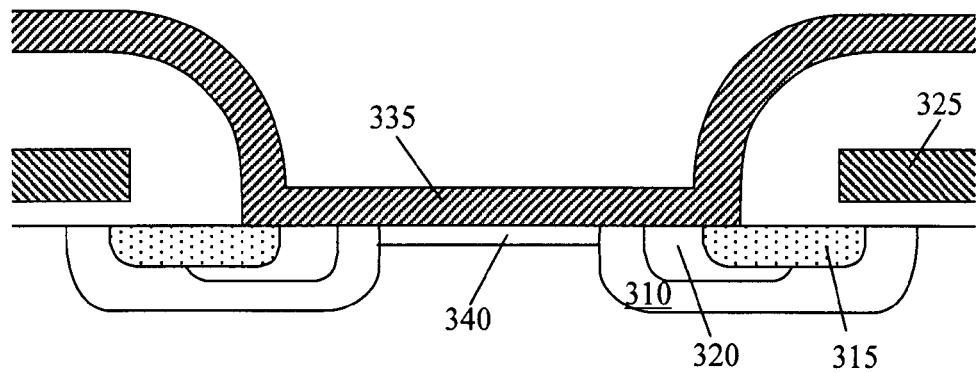
Figure 9C:
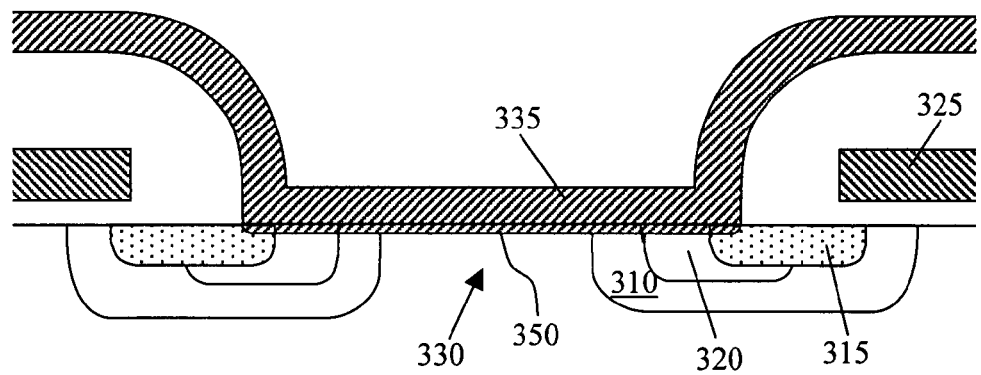

Referring to FIGS. 9A to 9C for three side cross-sectional views of a single cell of three FET integrated with Schottky diode devices as alternate embodiments of this invention. The FET integrated Schottky device of FIG. 9A is formed on an N− substrate 305. The FET integrated Schottky device includes a planar FET region formed with a P-body regions 310 that encompasses a N+ source region 315 and a heavy body P+ contact region 320 on two opposite sides of a planar gate 325 formed on top of the substrate across two opposite source regions 315. The Schottky region 330 is disposed between the P-body regions 310 of the FETs covered by an Schottky metal layer 335. In FIG. 9A, the Schottky metal is in direct contact with N region 330 of epitaxial layer. In FIG. 9B, an ultra-shallow N-Shannon layer 340 is implanted immediately under the Schottky metal layer 335 to alter the barrier height. In FIG. 9C, an Schottky metal layer 350 is formed with a thin layer of narrow bandgap material underneath the metal layer 335 to form a junction that has a low injection efficiency and a low Vbi voltage. The DMOS device as shown in FIGS. 9A-9C provide the advantage of integrating a Schottky in every cell. Further the P body regions 310 surrounding the P+ contact implant regions 320 provide the same function as the P− regions surrounding the P+ Schottky pocket regions near the top surface of the epitaxial layer in FIG. 4 therefore the breakdown voltage in the JBS regions is improved. According to FIGS. 9A to 9C and other drawings with all the descriptions of the drawings, this invention discloses a semiconductor power device supported on a semiconductor substrate 305 of a first conductivity type, e.g., an N-type substrate, having a bottom layer functioning as a bottom electrode and an epitaxial layer overlying the bottom layer having a same conductivity type as the bottom layer (see FIG. 2 for the bottom drain electrode and FIGS. 3A to 3E and 4A for the epitaxial layer supported on an n+ substrate). The semiconductor power device comprises a plurality of FET cells (see FIG. 8 for the FET cells.) FIGS. 9A to 9C show that each FET cell further comprises a body region, i.e., regions 310, of a second conductivity type, e.g., P-type body regions 310, extending vertically from a top surface into the epitaxial layer and laterally surrounding outer edges of each of the FET cells underneath a planar insulated gate, e.g., gate 325, disposed substantially in a central portion of the FET cell on the top surface of the semiconductor substrate. Each of the FET cells further includes a source region of the first conductivity type, e.g., N-type source regions 315, encompassed in the body region, e.g., P-body region 310, immediately under and laterally surrounding outer edges of the planar insulated gate 325. Each of the FET cells further includes a heavy body dopant region of said second conductivity type, the heavy P+ contact region 320, encompassed in the body region 315 and disposed underneath and extends outwardly toward and terminates before reaching the outer edges of the FET cells thus forming a Schottky pocket near the top surface of the semiconductor substrate in the body region 310. As shown in FIGS. 9A to 9C, a Schottky metal layer 335 is disposed on the top surface of the epitaxial layer extends laterally from an outer edges of the source region 315 across an area of the top surface of the semiconductor substrate over the heavy body dopant region 320 and the Schottky pocket in the body region near the top surface of the semiconductor substrate surrounding the heavy body dopant region 320, wherein the Schottky metal layer 335 further extending over an area on the top surface of the semiconductor substrate across an open substrate region between two of the FET cells and then further extends to the outer edge of the source region 315 of another FET cell thus forming an integrated Schottky junction diode for the FET cells. In an embodiment, the Schottky metal layer 325 further comprises a Ti/TiN layer. In another embodiment, each of the FET cells further comprises a closed FET cell as that shown in FIG. 8.

Figure 10A:
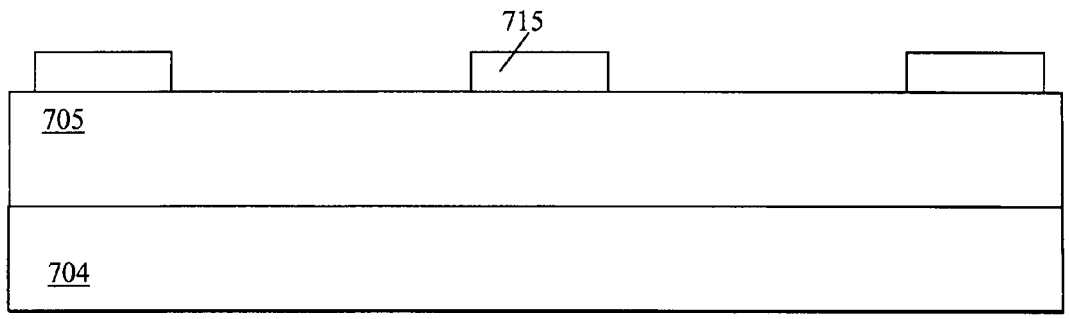
FIGS. 10A to 10H are a serial cross sectional views for describing the manufacturing processes to provide a trenched MOSFET device as shown in FIG. 9A.
Figure 10B:
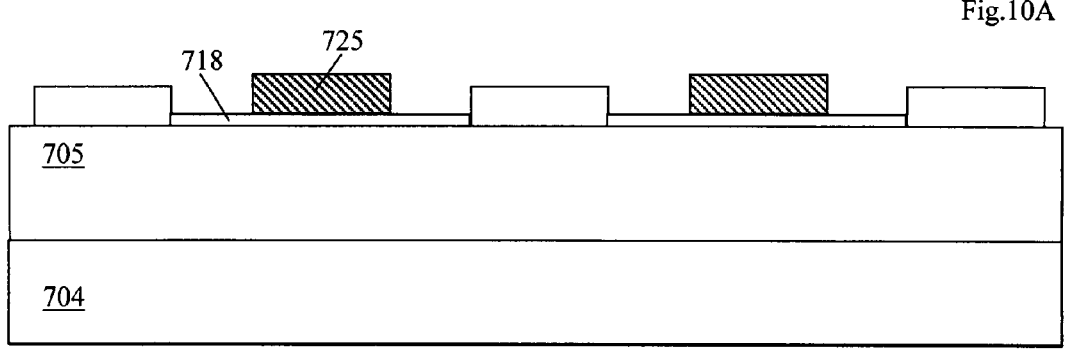
Figure 10C:
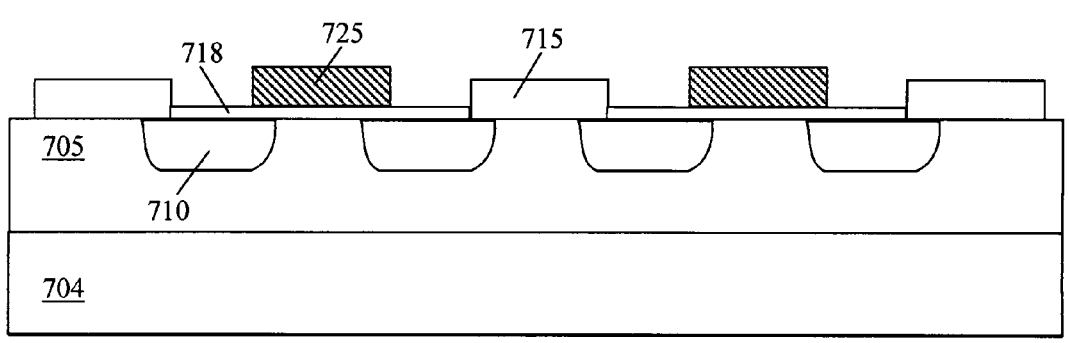
Figure 10D:
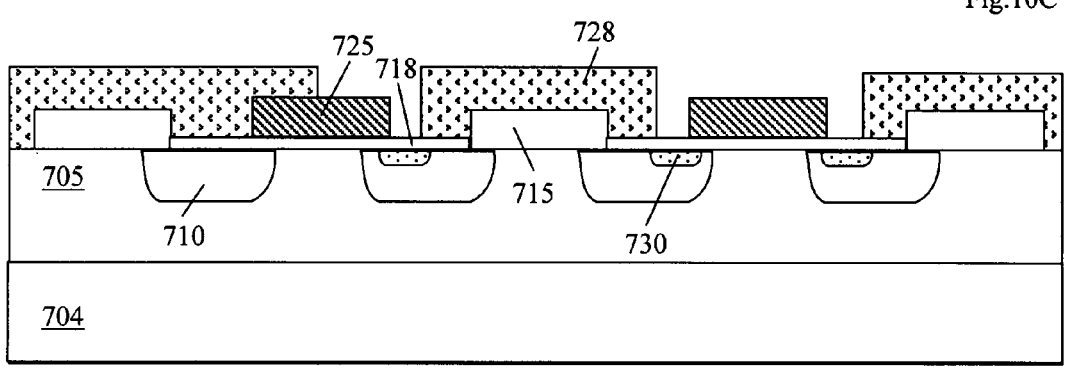
Figure 10E:
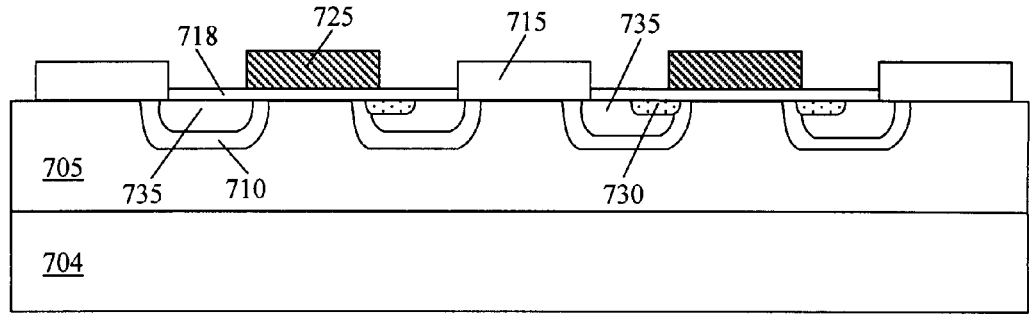
Figure 10F:
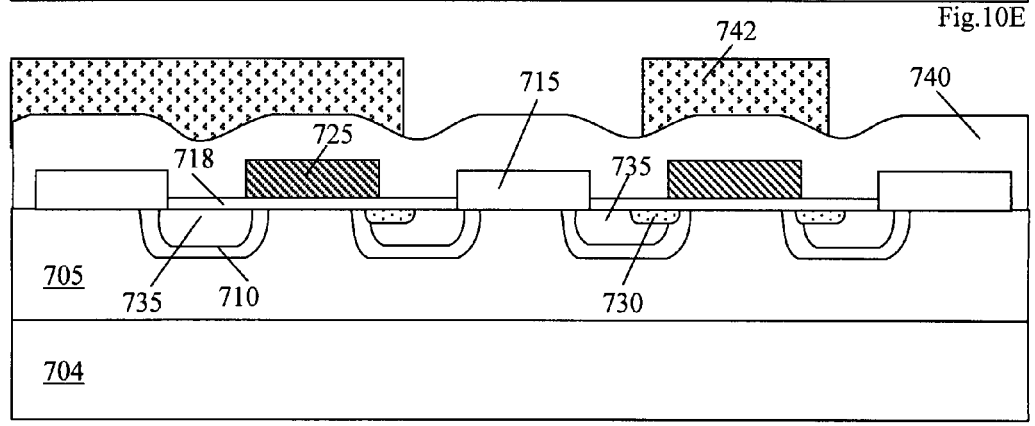
Figure 10G:
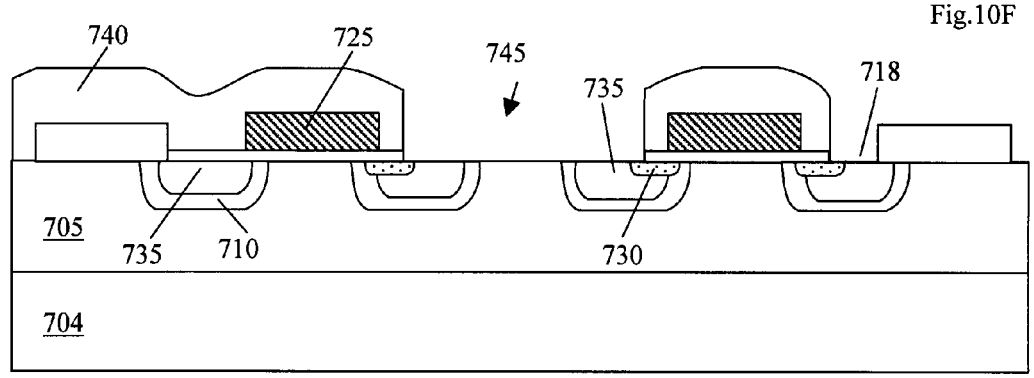
Figure 10H:
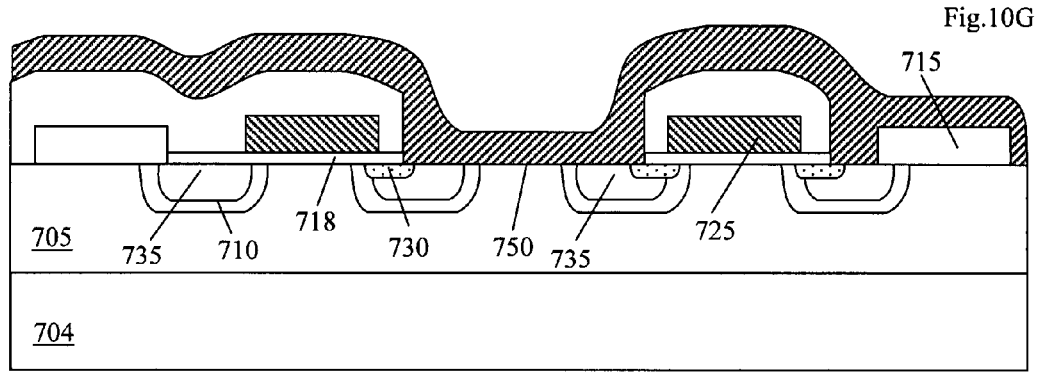

Referring to FIGS. 10A to 10E for the process of manufacturing a MOSFET with integrated Schottky according to this invention. In FIG. 10A, a Schottky hard mask 715 is formed by patterning a thick oxide layer on top of a semiconductor substrate comprising a N−epi layer 705 overlaying a N+ substrate layer 704. Thick oxide layer 715 may be form by deposition and should be thick enough to block ion implantation in the following steps. In one embodiment the layer of hard mask oxide is between 3000 A to 1 micron. In FIG. 10B a thin gate dielectric layer 718 such as a thermal oxide layer is grown followed by the deposition of a doped polysilicon layer 725 with a thickness comparable to that of hard mask 715 to block the following ion implant. Polysilicon layer 725 is patterned with a gate mask to form gate 725 overlaying gate oxide 718. In FIG. 10C, a P dopant implant is carried out using the hard mask 715 and gate 725 as implant block followed by a drive in process at elevated temperature to form P body regions 710. In one embodiment Boron implant with 5-7 E13/cm2 dose at 60 Kev is performed followed by 30 minutes of drive in at 1100 C. In FIG. 10D, a source mask 728 is form on top of the surface and N+ dopant is implanted through the gap between the mask 728 and gate 725. To ensure the overlap between gate 725 and source 730, angle implant is preferred. In one embodiment the source is implanted with Arsenic ions at the energy level of 80 Kev with the dosage of 4E15. The source mask 728 is then removed and a P+ vertical implant is carried out self-aligned to the hard mask 715 and gate 725 as shown in FIG. 10E. Multiple implants with different energy level can be applied to form a deep P+ region to avoid latch-up caused by the parasitic bipolar turn on and to have a good ohmic contact on the surface. In a preferred embodiment P+ regions 735 are formed by a Boron implant with 1E15 at 120 Kev followed by a second Boron implant with 1E15 at 30 Kev. In FIG. 10F a BPSG layer 740 is deposited over all the surface and flow at an elevated temperature to create a substantially smooth surface. The high temperature flowing process also activate the source regions 730 and the P+ regions 735. A contact mask 742 is applied to etch off the BPSG not covered by mask. The hard mask layer 715 is etched off at the same time to expose contact openings 745 in FIG. 10G. Optional steps of ultra-shallow Shannon implant or narrow bang gap material layer may be carried out to form Schottky barrier adjusting layer to adjust the height and width of barrier junction as described in another co-pending patent application Ser. No. 11/890,851 filed on Aug. 8, 2007. The disclosures made in patent application Ser. No. 11/890,851 are hereby incorporated by reference. In this application A Schottky barrier metal layer such as Ti/TiN is deposited over the surface to form Ohmic contact with source and body regions and to form Schottky junctions 750 in the area between the body regions. As shown in FIG. 10H a Schottky diode is therefore formed between every MOSFET cell. The process continues with standard DMOS process after metal deposition to etch metal layer into source contact and gate contact and to deposit passivation layer as needed.

Figure 11:
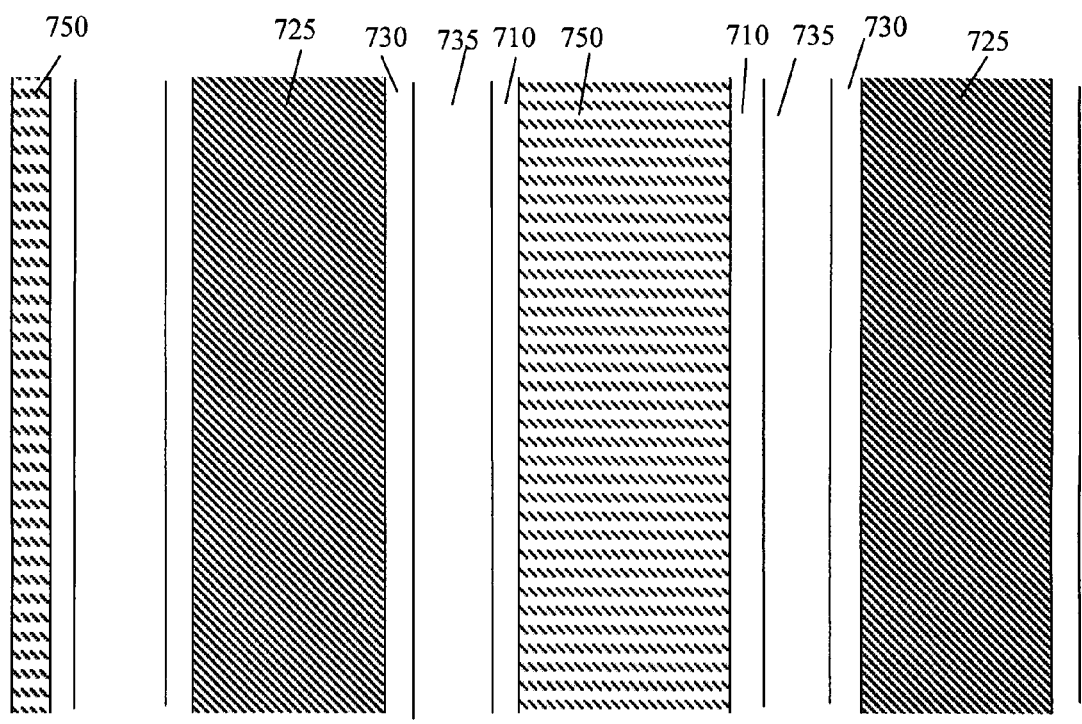
FIG. 11 is a top view for illustrating a layout of an Schottky device of this invention.

FIG. 11 is a top view of a Schottky-FET device according to the process described above that has a straight linear layout configuration with substantially parallel columns of gate 725 in one direction and source regions 730, body regions 710 and heavy body regions 735 along each side of gate columns. Between the FET areas are the Schottky areas 750 also configured in parallel columns. The heavy body P+ regions 735 provide the JBS Schottky pockets for the Schottky areas to pinch off the Schottky junction at reversed bias. The lower dopant P regions 710 surrounding the Schottky pockets 735 help to reduce the electric field across the P-N junction in the Schottky pocket region. Furthermore, it greatly reduces the fringing electric field. As a result, the premature breakdown due to abrupt dopant distribution and sharp corner are eliminated. The layout utilizes the area efficiently for FET but the P+ and P body regions are along only the two sides of the Schottky contact stripe and the pinch off may not be as effective.

Figure 12A:
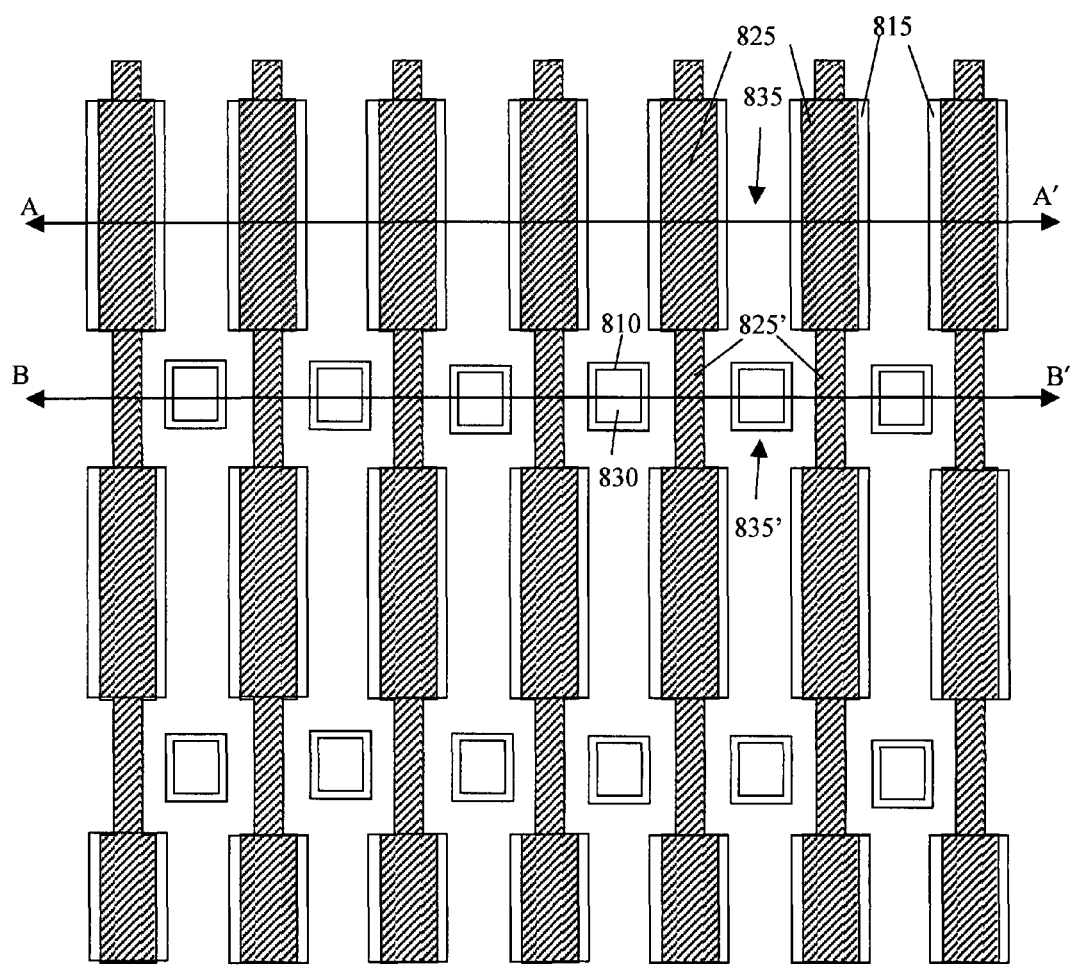
FIG. 12A is a top view for illustrating another layout of an Schottky device of this invention.
Figure 12B:
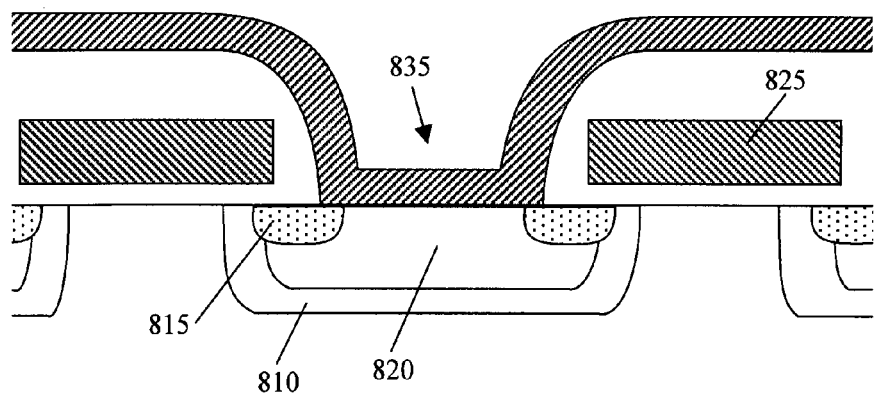
FIGS. 12B and 12C are cross sectional view of a FET area and an Schottky area across two different areas shown in FIG. 12A.
Figure 12C:
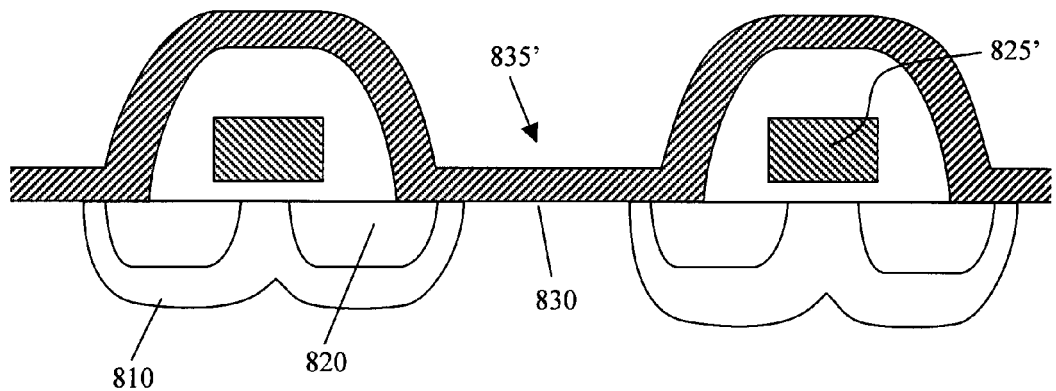
Figure 12D:
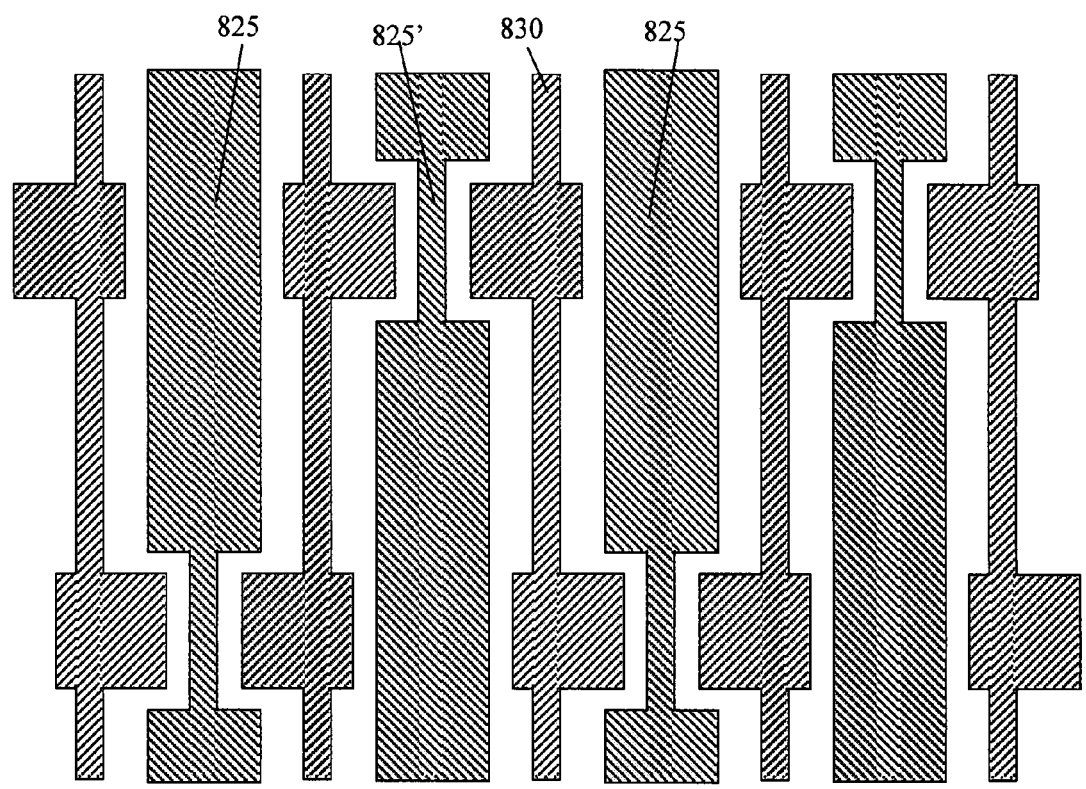
FIG. 12D is a top view for illustrating another layout of the Schottky diode device of this invention.

FIG. 12A is a top view to illustrate the cell layout of the Schottky device that includes alternate FET areas and the Schottky areas with reduced Schottky leakage. As shown in FIG. 12A the gate columns further include alternate narrow gate portions 825' and wide gate portions 825 along the length of gate columns. The narrow portions on each gate column aligned with the narrow portions of next column, leaving a wide space 835' between narrow gate portions and a narrow space 835 between two wide gate portions. In one embodiment, the Schottky contact areas 830 are disposed beside the narrow gate portions 825' surrounded by the body dopant regions 810. In another embodiment wide Schottky contact areas are formed in the wide space 835' connected by narrow Schottky contact areas formed in narrow space 835 (not shown). In another embodiment, the source regions 815 are disposed only along both sides of wide gate portions 825. In another embodiment, the source regions 815 disposed along both the narrow and wide gate portions (not shown). FIG. 12B is a cross sectional view across the line A-A' for the FET area and FIG. 12C is a cross sectional view across the line B-B' over the Schottky area. into FIG. 12B, there is a narrow space 835 between the two wide gate regions 825. In one embodiment, the two body regions in narrow space 835 merge together to form one continues body region 810 and one heavy body region 820 without leaving space for Schottky contact. In FIG. 12C, in the Schottky area, there is a narrow polysilicon gate 825' with a wider space 835' in between for Schottky contact region 830 surrounded by body region 810. In one embodiment the body region in this area merge under the narrow gate 825' therefore no FET is formed in this area. In another embodiment, the width of narrow gate and spacing between the gate columns are optimize to leave space between two body regions below the narrow gate to form an active FET in the region (not shown). According to these embodiments, the ultra-shallow N− Shannon layer can be implanted immediately below the Schottky metal as that shown in FIG. 9B or a narrow bandgap material layer can be formed below the Schottky metal as that shown in FIG. 9C to provide the device performance advantages as described above. Instead of a layout configuration shown in FIG. 12A, FIG. 12D is another layout configuration where the narrow gate portions on a gate column 825' are aligned to the wide gate portions 825 of the next gate columns and the Schottky area and the FET area are arranged in such a way that the FET areas and the Schottky areas are formed in an inter-mixed staggered configurations instead of uniformly across each horizontal array as that shown in FIG. 12A. In one embodiment, the wide Schottky contact areas are formed along both sides of narrow gate portions 825' connected by narrow Schottky contact areas formed along both sides of wide gate portions 825. In another embodiment, the Schottky contact areas 830 are disposed alongside the narrow gate portions 825' surrounded by the body dopant regions (not shown). The layouts as shown in FIGS. 12A and 12D may sacrifice certain FET area to provide complete enclose P+ regions and P body regions surrounding the Schottky diode regions therefore provide better pinch off when a reverse Schottky diode voltage is applied.

Figure 13A:
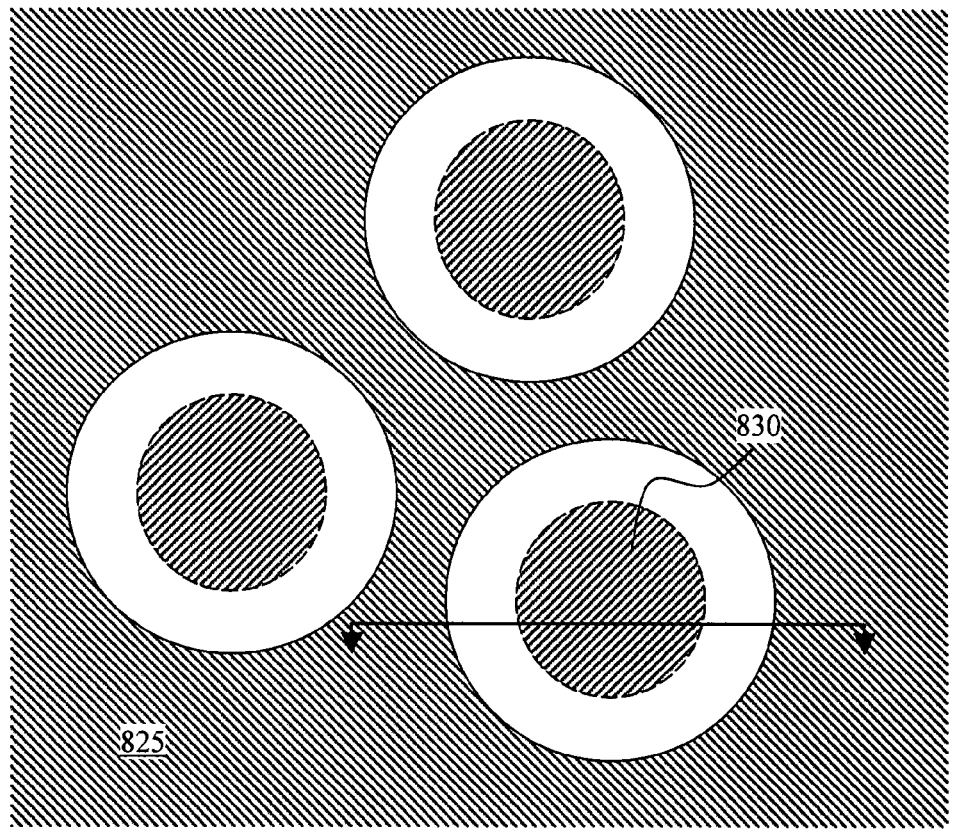
FIGS. 13A and 13B are top view and cross sectional view respectively of an Schottky device with a closed cell layout as an exemplary embodiment of this invention.
Figure 13B:
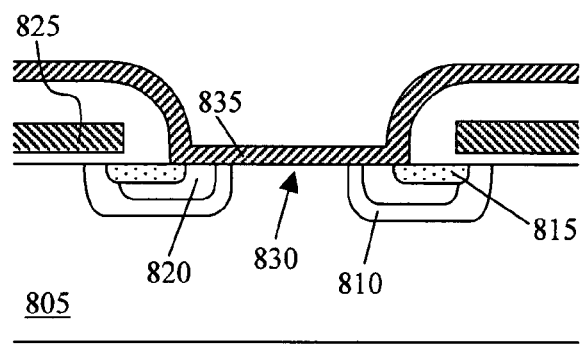

FIGS. 13A and 13B are a top view and a cross sectional view of another embodiment of a Schottky-FET device that has a closed cell configuration. The close cell layout may include a hexagonal, square, or circular cell layout configurations. The close cell structures provide circulate P+ and P body regions surrounding each Schottky junction contact therefore provide better pinch off when a reverse Schottky diode voltage is applied.

According to above drawings and descriptions, this invention also discloses a semiconductor power device supported on a semiconductor substrate of a first conductivity type having a bottom layer functioning as a bottom electrode and an epitaxial layer having a same conductivity type overlying the bottom layer. The semiconductor power device further includes a plurality of FET power cells includes a FET body regions having a second conductivity type deposited underneath the end of a gate and each of the FET body regions encompassing a source region therein doped with ions of first conductivity type and each of the FET body regions further includes heavy body dopant a Schottky contact region next to the source region doped with ions of the second conductivity with higher dopant concentration than the FET body regions. A plurality of Schottky diodes are disposed between the FET body regions constituting doped JBS regions near a top surface of the semiconductor substrate constituting a junction barrier Schottky (JBS) with the epitaxial layer disposed between FET body regions. And a Schottky contact metal layer is disposed on a top surface between the FET body regions constituting an ohmic contact to the Schottky contact region encompassed in the body regions and covering the epitaxial layer between the FET body regions wherein the epitaxial layer between the FET body regions further having a shallow layer of doped region for enhancing a performance of the Schottky diodes. In an exemplary embodiment, the shallow layer of doped region further includes a shallow doped region with ions of the first conductivity type with an ion concentration higher than the epitaxial layer. In another exemplary embodiment, the shallow layer of doped region further includes a shallow Shannon doped region with ions of the second conductivity type for adjusting a barrier height of the Schottky diodes. In another exemplary embodiment, the power device further includes a layer of narrow bandgap metal disposed over the shallow layer of doped region to form a low injection efficiency low Vbi junction to function as a quasi Schottky. (Please explain what does it mean by Quasi-Schottky) In another exemplary embodiment, the shallow layer of doped region further includes a shallow P−Shannon doped region for adjusting a barrier height of the Schottky diodes supported on the semiconductor substrate of a N-type conductivity. In another exemplary embodiment, the semiconductor power device further having a two dimensional layout arranged with alternate columns of gate covering with polysilicon gate disposed adjacent to and substantially parallel to columns of a Schottky contact metal covering the epitaxial region between the FET body regions. In another exemplary embodiment, the two dimensional layout further includes FET areas having narrower Schottky contract metal between wider polysilicon gate and Schottky areas having narrower polysilicon gate between wider Schottky contact metal wherein the FET areas and the Schottky areas are arranged over alternate columns and aligned across the columns of gate and columns of Schottky contact metal. In another exemplary embodiment, the semiconductor power device further having a two dimensional layout arranged with Schottky areas surrounded by FET areas covering with polysilicon gates wherein the Schottky areas constitute closed cells with the Schottky contact metals metal disposed substantially in a central portion of the Schottky areas insulated from the polysilicon gates by an insulation layer covering over the polysilicon gates surrounding the Schottky areas. In another exemplary embodiment, the Schottky areas constitute substantially circular closed cells. In another exemplary embodiment, the Schottky areas constituting substantially square closed cells. In another exemplary embodiment, the Schottky areas constitute closed cells substantially of a polygon shape.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A semiconductor power device supported on a semiconductor substrate of a first conductivity type having a bottom layer functioning as a bottom electrode and an epitaxial layer overlying said bottom layer having a same conductivity type as said bottom layer, said semiconductor power device comprising:

a plurality of FET cells wherein each FET cell further comprises a body region of a second conductivity type extending vertically from a top surface into said epitaxial layer and laterally surrounding outer edges of each of the FET cells underneath a planar insulated gate disposed substantially in a central portion of the FET cell on the top surface of the semiconductor substrate;

each of said FET cells further includes a source region of the first conductivity type encompassed in said body region immediately under and laterally surrounding outer edges of said planar insulated gate;

each of said FET cells further includes a heavy body dopant region of said second conductivity type encompassed in said body region and disposed underneath and extends outwardly toward and terminates before reaching the outer edges of the FET cells thus forming a Schottky pocket near the top surface of the semiconductor substrate in said body region;

a Schottky metal layer disposed on the top surface of the epitaxial layer extends laterally from an outer edges of the source region across an area of the top surface of the semiconductor substrate over the heavy body dopant region and the Schottky pocket in of the body region near the top surface of the semiconductor substrate surrounding the heavy body dopant region, wherein said Schottky metal layer further extending over an area on the top surface of the semiconductor substrate across an open substrate region between two of said FET cells and then further extends to the outer edge of the source region of another FET cell thus forming an integrated Schottky junction diode for the FET cells; and each of said FET cells further comprises a closed FET cell.

2. The semiconductor power device of claim 1 wherein: the Schottky metal layer further comprises a Ti/TiN layer.

* * * * *